(12) United States Patent
Banerjee et al.

(10) Patent No.: US 7,791,132 B2
(45) Date of Patent: Sep. 7, 2010

(54) HIGH-VOLTAGE VERTICAL TRANSISTOR WITH A MULTI-GRADIENT DRAIN DOPING PROFILE

(75) Inventors: Sujit Banerjee, San Jose, CA (US); Donald Ray Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 12/655,697

(22) Filed: Jan. 4, 2010

(65) Prior Publication Data

US 2010/0109077 A1 May 6, 2010

Related U.S. Application Data

(60) Continuation of application No. 12/288,883, filed on Oct. 24, 2008, now Pat. No. 7,648,879, which is a continuation of application No. 12/004,166, filed on Dec. 19, 2007, now Pat. No. 7,459,366, which is a continuation of application No. 11/699,936, filed on Jan. 30, 2007, now Pat. No. 7,335,944, which is a division of application No. 11/042,665, filed on Jan. 25, 2005, now Pat. No. 7,221,011, which is a continuation-in-part of application No. 10/393,759, filed on Mar. 21, 2003, now Pat. No. 6,882,005, which is a continuation of application No. 09/948,930, filed on Sep. 7, 2001, now Pat. No. 6,573,558.

(51) Int. Cl.
*H01L 29/772* (2006.01)
(52) U.S. Cl. ............... 257/328; 257/335; 257/488; 257/E29.009; 257/E29.256
(58) Field of Classification Search ............... 438/454; 257/E29.009
See application file for complete search history.

(56) References Cited

U.S. PATENT DOCUMENTS

2002/0175351 A1* 11/2002 Baliga .................. 257/242

* cited by examiner

*Primary Examiner*—Stephen W Smoot
(74) *Attorney, Agent, or Firm*—The Law Offices of Bradley J. Bereznak

(57) ABSTRACT

A high-voltage transistor includes first and second trenches that define a mesa in a semiconductor substrate. First and second field plate members are respectively disposed in the first and second trenches, with each of the first and second field plate members being separated from the mesa by a dielectric layer. The mesa includes a plurality of sections, each section having a substantially constant doping concentration gradient, the gradient of one section being at least 10% greater than the gradient of another section. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

8 Claims, 10 Drawing Sheets

HIGH-VOLTAGE VERTICAL TRANSISTOR WITH A MULTI-GRADIENT DRAIN DOPING PROFILE

RELATED APPLICATIONS

This is a continuation of application Ser. No. 12/288,883 filed Oct. 24, 2008, now U.S. Pat. No. 7,648,879, which is a continuation of Ser. No. 12/004,166 filed Dec. 19, 2007, now U.S. Pat. No. 7,459,366, which is a continuation of Ser. No. 11/699,936 filed Jan. 30, 2007, now U.S. Pat. No. 7,335,944, which is a division of application Ser. No. 11/042,665 filed Jan. 25, 2005, which is a continuation-in-part (CIP) application of application Ser. No. 10/393,759 filed Mar. 21, 2003, now U.S. Pat. No. 6,882,005, which is a continuation of Ser. No. 09/948,930 filed Sep. 7, 2001, now U.S. Pat. No. 6,573,558, all of which are assigned to the assignee of the present application.

FIELD OF THE INVENTION

The present invention relates to semiconductor devices fabricated in a silicon substrate. More specifically, the present invention relates to field-effect semiconductor transistor structures capable of withstanding high voltages.

BACKGROUND OF THE INVENTION

High-voltage, field-effect transistors (HVFETs) are well known in the semiconductor arts. Most often, HVFETs comprise a device structure that includes an extended drain region that supports the applied high-voltage when the device is in the "off" state. HVFETs of this type are commonly used in power conversion applications such as AC/DC converters for offline power supplies, motor controls, and so on. These devices can be switched at high voltages and achieve a high blocking voltage in the off state while minimizing the resistance to current flow in the "on" state. The blocking or breakdown voltage is generally denoted as Vbd. The acronym Rsp refers to the product of the resistance and surface area, and is generally used to describe the on-state performance of the device. An example of a prior art HVFET having an extended drain region with a top layer of a conductivity type opposite that of the extended drain region is found in U.S. Pat. No. 4,811,075.

In a conventional HVFET the extended drain region is usually lightly doped to support high voltages applied to the drain when the device is off. The length of the extended drain region is also increased to spread the electric field over a larger area so the device can sustain higher voltages. However, when the device is on (i.e., conducting) current flows through the extended drain region. The combined decrease in doping and increase in length of the extended drain region therefore have the deleterious effect on the on-state performance of the device, as both cause an increase in on-state resistance. In other words, conventional high-voltage FET designs are characterized by a trade-off between Vbd and Rsp.

To provide a quantitative example, a typical prior art vertical HVFET (NMOS-type) may have a Vbd of 600V with a Rsp of about 16 ohm-mm$^2$. Increasing the length of the extended drain would affect device performance by increasing Vbd beyond 600V at the expense of a higher Rsp value. Conversely, reducing the length of the extended drain would improve the on-state resistance to a value below 16 ohm-mm$^2$, but such a change in the device structure would also cause Vbd to be reduced to less than 600V.

A device structure for supporting higher Vbd voltages with a low Rsp value is disclosed in U.S. Pat. Nos. 4,754,310, 5,438,215, and also in the article entitled, "*Theory of Semiconductor Superjunction Devices*" by T. Fujihira, Jpn. J. Appl. Phys., Vol. 36, pp. 6254-6262, October 1977. In this device structure the extended drain region comprises alternating layers of semiconductor material having opposite conductivity types, e.g., PNPNP . . . . As high voltage is applied to the layers of one conductivity type, all of the layers are mutually depleted of charge carriers. This permits a high Vbd at much higher conducting layer doping concentrations as compared to single layer devices. The higher doping concentrations, of course, advantageously lower the Rsp of the transistor device. For example, in the article entitled, "*A new generation of high voltage MOSFETs breaks the limit line of silicon*" by G. Deboy et al., IEDM tech. Digest, pp. 683-685, 1998, the authors report a vertical NMOS device with a Vbd of 600V and a Rsp of about 4 ohm-mm$^2$.

Another approach to the problem of achieving high-voltage capability is disclosed in the paper, "*Realization of High Breakdown Voltage in Thin SOI Devices*" by S. Merchant et al., Proc. Intl. Symp. on Power Devices and ICs, pp. 31-35, 1991. This paper teaches an extended drain region that comprises a thin layer of silicon situated on top of a buried oxide layer disposed on top of a semiconductor substrate. In operation, the underlying silicon substrate depletes charge from the thin silicon layer at high voltages. The authors claim that high values of Vbd are obtained as long as the top silicon layer is sufficiently thin, the buried oxide layer is sufficiently thick and the drift region doping concentration increases linearly from source to the drain. For instance, a lateral NMOS device with Vbd of 600V and Rsp of about 8 ohm-mm$^2$ is obtained using this approach. The same authors have disclosed their technique of manufacturing the device with linearly graded doping concentration in U.S. Pat. No. 5,300,448. Similar approaches are taught in U.S. Pat. Nos. 5,246,870, 5,412,241, 5,648,671, and 6,767,547.

Many conventional high-voltage transistors are designed to optimize breakdown voltage in the off-state. In the off-state, avalanche breakdown in high-voltage field-effect transistors typically occurs at the drain voltage at which the impact ionization integral (I) equals unity and the multiplication factor (M), defined as M=1/(1−I), approaches infinity. In the on-state, electron current flows through the drift region of the device. At high drain voltages, the electrons pass through regions of high electric field, causing impact ionization, which generates hole current in the device. If the hole current reaches a sufficiently high level, a parasitic bipolar transistor might become activated, leading to destructive breakdown of the device.

To maintain a high breakdown voltage in the on-state, the multiplication factor needs to be kept at a low level. This constraint places a limit on the maximum electric field for which the device can be designed, which limit may be less than optimal for high off-state breakdown voltage. Consequently, one problem in prior art high-voltage transistors is that the device suffers from low on-state breakdown voltage when the electric field is increased, and low off-state breakdown voltage (for a given drift length) if the field is reduced.

Although many of the device structures described above achieve high Vbd with relatively low on-state resistance as compared to earlier designs, there is still an unsatisfied need for a high-voltage transistor structure that optimizes both the on-state and off-state breakdown voltages of the device simultaneously.

BRIEF DESCRIPTION OF THE DRAWINGS

The present invention is illustrated by way of example, and not limitation, in the figures of the accompanying drawings, wherein.

DETAILED DESCRIPTION

A high-voltage field-effect transistor (HVFET) having an extended drain or drift region and a method for making the same is described. The HVFET has a low specific on-state resistance and supports high voltage in the off-state. In the following description, numerous specific details are set forth, such as material types, doping levels, structural features, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

Figure 1:
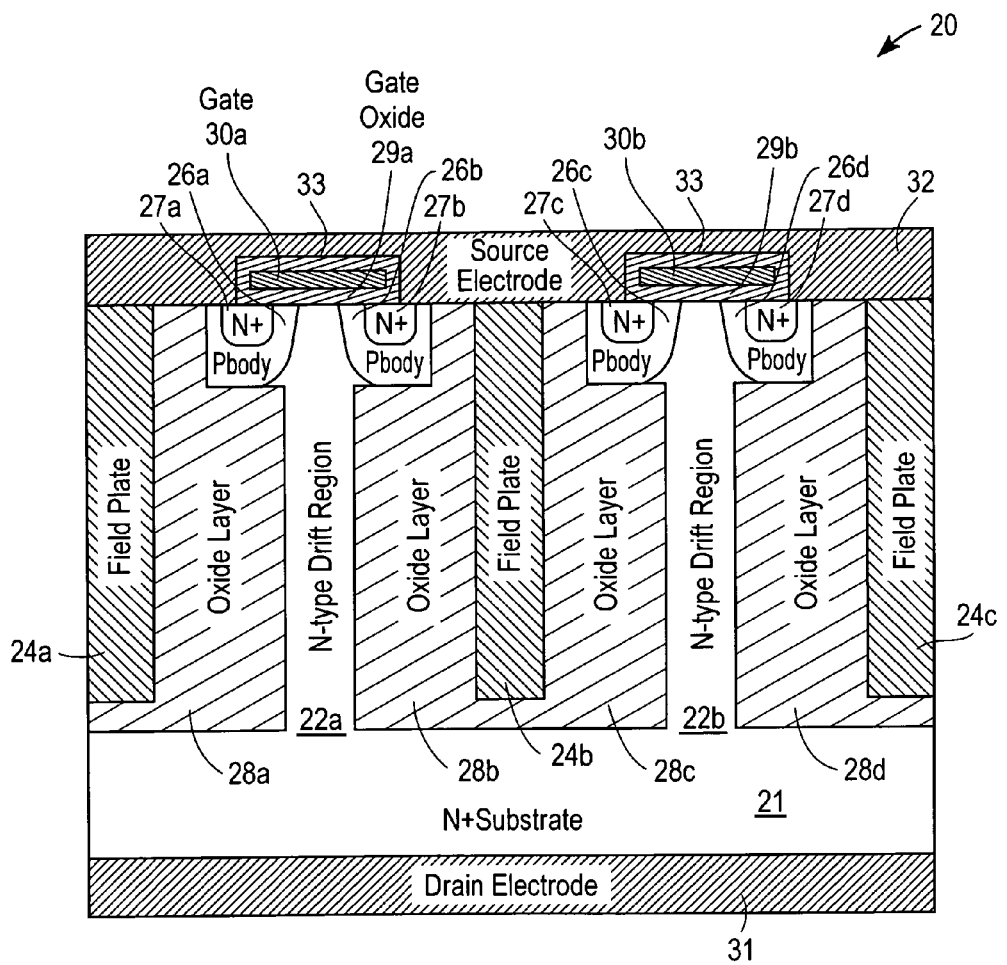
FIG. 1 is a cross-sectional side view of a vertical high-voltage, field-effect transistor (HVFET) device structure in accordance with one embodiment of the present invention.

FIG. 1 is a cross-sectional side view of a vertical n-channel (i.e., NMOS) HVFET 20 in accordance with one embodiment of the present invention. It should be understood that the elements in the figures are representational, and are not drawn to scale in the interest of clarity. It is also appreciated that a p-channel transistor may be realized by utilizing the opposite conductivity types for all of the illustrated diffusion/doped regions. Furthermore, although the figure appears to show two separate devices, those of skill will understand that such transistor structures are commonly fabricated in an annular, inter-digitated, or otherwise replicated manner.

The device structure of FIG. 1 includes an insulated-gate, field-effect transistor (IGFET) having a gate 30 (comprised, for example, of polysilicon), and a gate-insulating layer 29 that insulates gate 30 from the underlying semiconductor regions. Gate-insulating layer 29 may comprise ordinary silicon dioxide or another appropriate dielectric insulating material. The extended drain region of vertical HVFET 20 comprises one or more N-type drift regions 22 situated between p-type body regions 26 and extending down to the N+ substrate 21. For instance, FIG. 1 shows drift region 22a extending from beneath gate oxide 29a between P-body regions 26a & 26b down to N+ substrate 21. Similarly, drift region 22b extends from gate oxide 29b between P-body regions 26c & 26d down to N+ substrate 21.

Source electrode 32 is electrically connected to N+ source regions 27, which are disposed in respective P-body regions 26. For example, N+ source region 27a is disposed in P-body region 26a; N+ region 27b is disposed in P-body region 27b, and so on. It is appreciated that a variety of alternative source electrode connections are also possible. The area of the P-body regions directly beneath gate 30 comprises the IGFET channel region of the transistor. In this particular embodiment, the gate region is a metal-oxide semiconductor (MOS), and the IGFET is a NMOS transistor. Thus, the channel regions of HVFET 20 are defined at one end by N+ source regions 27 and at the other end by N-type drift regions 22, which extend vertically from gate oxide 29 down to the N+ substrate 21. Insulating layers 33 separate gate 30 from source electrode 32.

The n-type extended drain or drift regions 22 are separated laterally by insulating regions or dielectric layers 28. In the embodiment of FIG. 1, dielectric layers 28 extend vertically from beneath P-body regions 26 down to N+ substrate 21 along the full vertical length of the drift regions 22. By way of example, dielectric layers 28 may comprise silicon dioxide, but other insulating materials, such as silicon nitride, may also be used. Disposed within each of the dielectric layers 28, and fully insulated from the semiconductor substrate 21 and drift regions 22, is a field plate member 24. Field plate members 24 comprise a conducting layer of material such as heavily doped polysilicon, metal, metal alloys, etc. As shown in the embodiment of FIG. 1, each of the field plate members 24 is electrically connected to source electrode 32. Alternatively, the field plate members may be connected to a separate electrode. Gates 30 are also connected to a separate electrode (not shown). Drain electrode 31 provides electrical connection to the bottom of N+ substrate 21.

The extended drain region of vertical NMOS high-voltage transistor 20 of FIG. 1 consists of a plurality of laterally interleaved layers of doped semiconductor material (e.g., n-type), insulating material (e.g., silicon dioxide), and conducting material (e.g., heavily-doped polysilicon). In the on state, a sufficient voltage is applied to the gate such that a channel of electrons is formed along the surface of the P-body regions 26. This provides a path for electron current flow from source electrode 32, N+ source regions 27, through the channel regions formed in P-body regions 26, down through the N-type drift regions 22, through the N+substrate 21, to drain electrode 31.

Practitioners in the semiconductor arts will note that in a conventional vertical HVNMOS transistor, the N-type drift region is normally very thick (i.e., long) and lightly doped; both of which contribute to high on state resistance. In the device structure of FIG. 1, on the other hand, the doping in the N-type drift regions may be considerably higher, such that the on-state resistance is dramatically lowered.

In the off state, a high voltage (e.g., 200V-1200V) is applied across the respective drain and source electrodes 31 and 32. As the voltage increases, the presence of field plate regions 24 on opposite sides of drift regions 22 cause the N-type drift regions to become depleted of free carriers. The doping profile in the drift regions 22 may be tailored such that the resulting electric field is approximately constant along the path from the drain to the source. For example, the doping concentration may be highest near the N+ substrate 21, lowest the near the P-body regions 26, and linearly graded in between. In other embodiments, the doping profile gradient in the drift regions 22 varies (i.e., a different slope) as a function of the vertical depth of the drift region. In other words, the doping profile gradient may be steepest near substrate 21 and shallowest near the P-body regions 26. This aspect of the present invention is discussed in more detail below.

The width of both the N-type drift regions 22 and oxide layers 28 should be designed so as to prevent premature avalanche breakdown. Avalanche breakdown can be avoided by making the drift region relatively narrow, which reduces the ionization path and thereby increases the critical electric field at which avalanche occurs. In the same regard, making oxide layers 28 relatively wide allows the device structure to support a larger voltage for a given electric field.

By way of example, a device manufactured in accordance with FIG. 1 having a drift region that is about 50 um high and about 2.0 um wide, with an oxide layer width of approximately 4.0 um is capable of supporting about 600V. In such a device, the doping in the drift region may be linearly graded from about $2 \times 10^{15}$ cm$^{-3}$ near the P-body regions to about $4 \times 10^{16}$ cm$^{-3}$ near the N+ substrate. The on-state resistance of such a device is about 1.7 ohm-mm$^2$.

Practitioners in the art will appreciate that the device performance for HVFET 20 may be improved when manufactured as a smaller total cell pitch (i.e., combined width of field plate, oxide layer and drift regions) because the contribution of each drift region is fairly constant.

Figure 2:
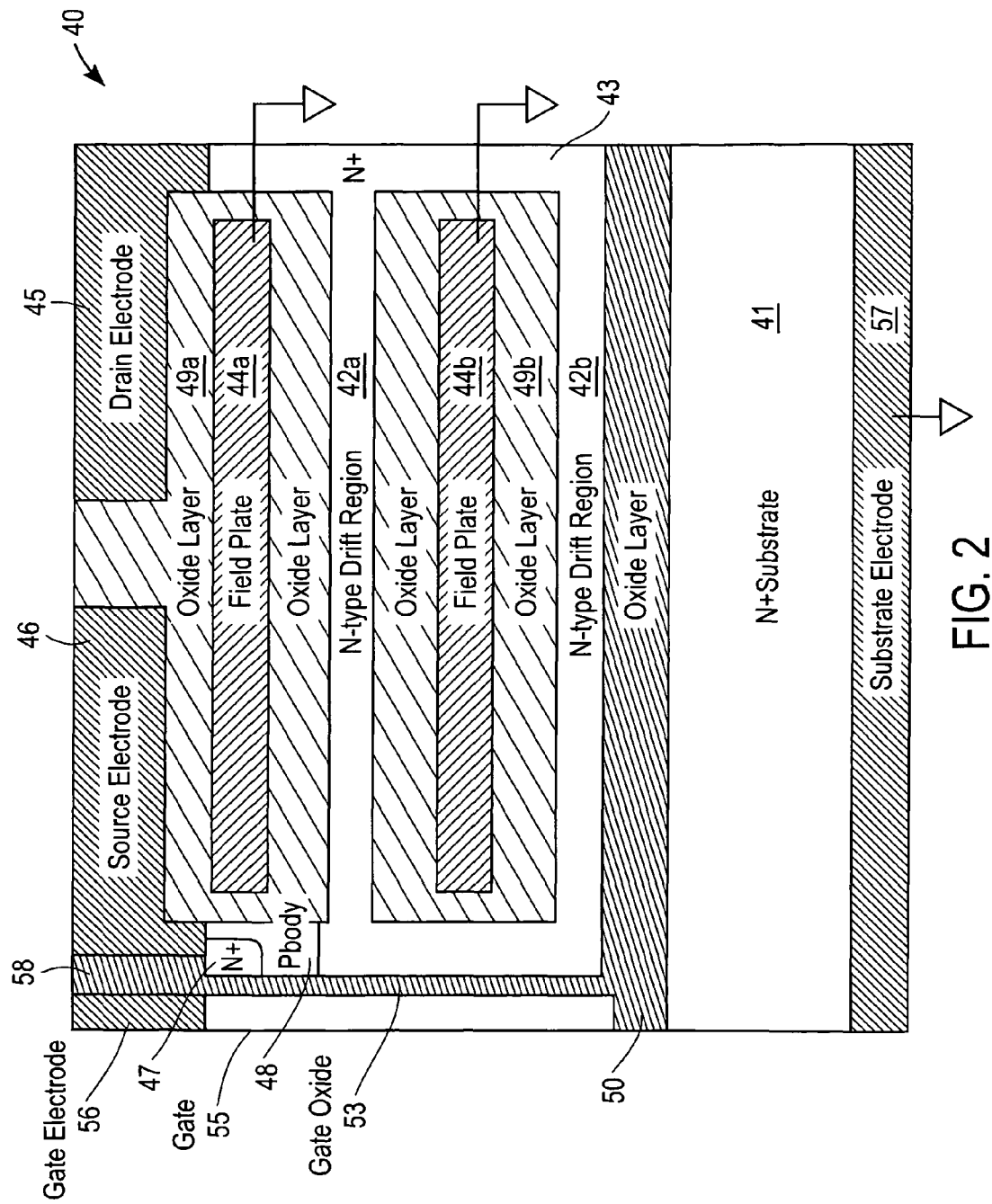
FIG. 2 is a cross-sectional side view of one embodiment of a lateral HVFET fabricated in accordance with the present invention.

Referring now to FIG. 2, there is shown a lateral NMOS high-voltage transistor 40 in accordance with another embodiment of the present invention. HVFET 40 of FIG. 2 operates according to the same principles discussed in connection with the transistor structure of FIG. 1, except that current flows laterally, as opposed to vertically, through the drift regions. Note that in the embodiment of FIG. 2, field plate members 44 are fully insulated from the semiconductor material by oxide layers 49.

In this example, field plate member 44a is disposed within oxide layer 49a just below the source and drain electrodes 46 and 45, respectively. Field plate member 44b is disposed within oxide layer 49b below N-type drift region 42a and above N-type drift region 42b. The field plate members may be connected to a field plate electrode at a certain location out of the plane of the figure. The N-type drift region, which comprises the extended drain of the transistor, extends laterally from beneath P-body region 48 across to N+ drain region 43. N+ drain region 43 connects both drift regions 42a & 42b with drain electrode 45.

An N+ source region 47, which is electrically connected to source electrode 46, is disposed adjacent P-body region 48. The HVFET 40 utilizes a vertical MOS gate structure 12 that comprises a gate electrode 56 that connects to gate 55. In this embodiment, gate 55 comprises a layer of polysilicon that extends vertically from gate electrode 56. Gate 55 extends below the P-body region, and may extend down to oxide layer 50, as shown. Gate 55 is insulated from N+ source region 47, P-body region 48, and N-type drift region 42 by gate oxide 53. An oxide region 58 separates gate electrode 56 from source electrode 46.

Oxide layer 50 insulates N+ substrate 41 from gate 55, N-type drift region 42, and N+ drain region 43. As can be seen, oxide layer 50 extends laterally over N+ substrate 41 beneath each of the regions 42, 43, and 55. Substrate electrode 57 provides electrical connection to the bottom of N+ substrate 41. The substrate may serve as the bottom field plate for drift region 42b.

The on-state and off-state operations of HVFET 40 are similar to those described for the embodiment of FIG. 1. In this case, however, the source and drain electrodes are located on the top surface. This means that electrons flows down through N+ source region 47, across the channel region formed in P-body region 48 adjacent to gate oxide 53, laterally across the N-type drift regions 42, and up through the N+ drain region 43 before reaching the drain electrode.

Note that even though FIG. 2 shows a trench gate structure, planar gate structures could also be used. Additionally, a trench drain structure could also be used in an alternative implementation. Furthermore, although the embodiment of FIG. 2 shows the extended drain region comprising two laterally extending parallel N-type drift regions 42a and 42b, other embodiments may utilize more than two parallel drift regions. In other words, the embodiment of FIG. 2 is not limited to just two drift regions, but could include any number of layers of drift, oxide, and field plate regions within manufacturing limits.

Figure 3A:
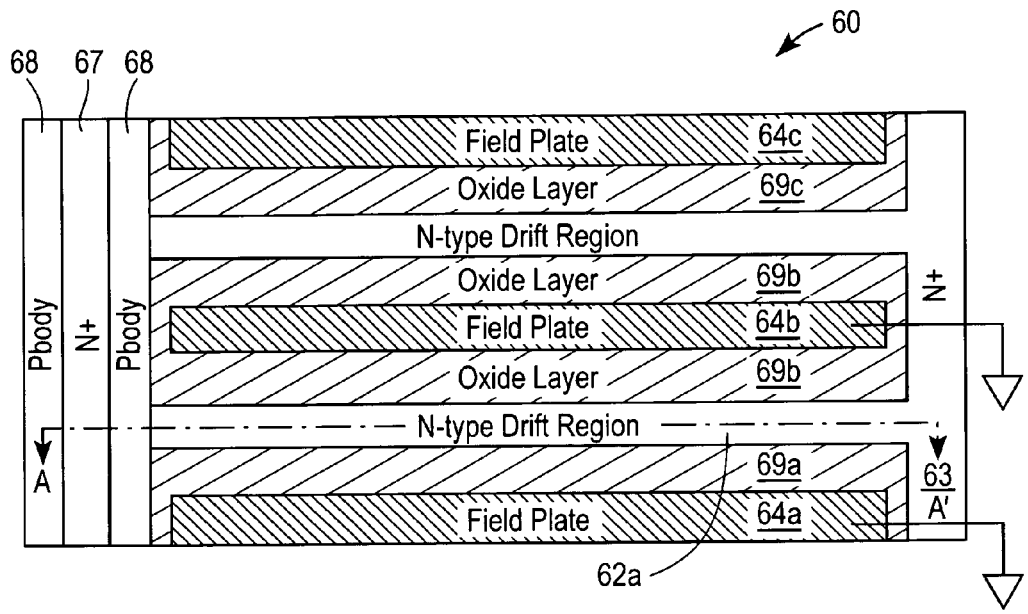
FIG. 3A is a top view of lateral HVFET fabricated in accordance with another embodiment of the present invention.
Figure 3B:
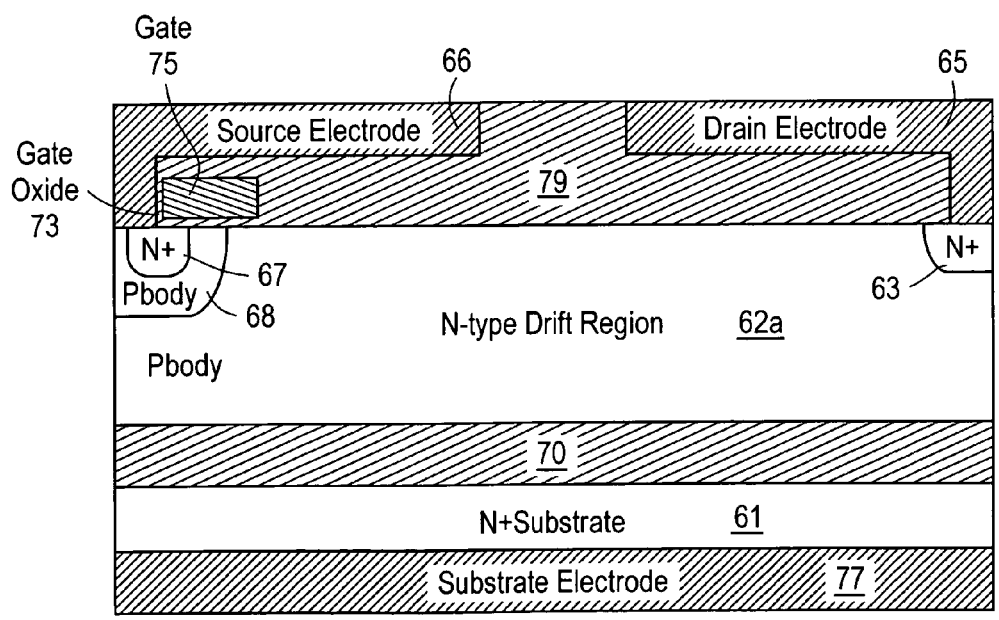
FIG. 3B is a cross-sectional side view of the lateral HVFET shown in FIG. 3A, taken along cut lines A-A'.

FIGS. 3A & 3B illustrate another embodiment of a lateral HVFET in accordance with the present invention. FIG. 3A is a top view of a lateral HVFET transistor 60, and FIG. 3B is a cross-sectional side view of the same device, taken along cut lines A-A', which extends through drift region 62a. (Note that the source electrode 66, drain electrode 65, gate 75, gate oxide 73 and oxide layer 79 are not depicted in FIG. 3A to avoid confusion. These elements are shown in the cross-sectional side view of FIG. 3B.)

The lateral device structure of FIG. 3 is similar to that shown in FIG. 2. But rather than orient the drift, oxide, and field plate layered regions on top of one another (vertically), the embodiment of FIG. 3 has these regions oriented side-by-side. Unlike the embodiment of FIG. 2, each of the N-type drift regions 62, oxide layers 69, and field plate members 64 extend from underlying insulating layer 70 toward the upper substrate surface. Each of the N-type drift regions 62 and field plate members 64 are insulated from N+ substrate 61 by insulating layer 70. In one embodiment, layer 70 comprises silicon dioxide. An additional electrode 77 provides electrical connection to the bottom of N+ substrate 61.

The planar gate and drain configurations of HVFET transistor 60 are illustrated in the side view of FIG. 3B. Alternatively, a trench drain structure and/or a trench gate structure may be utilized. In this embodiment, a gate member 75 is disposed above P-body region 68 and is insulated from the semiconductor substrate by a gate oxide 73. Source electrode 66 contacts N+ source region 67, which is disposed in P-body region 68. P-body region 68 is itself shown disposed in N-type drift region 62.

N+ drain region 63 is disposed at the opposite end of the N-type drift region 62 and is electrically connected to drain electrode 65.

The embodiments of FIGS. 2 and 3 each show the field plate members being coupled to the lowest chip potential, e.g., ground. The source may be tied to the field plate members (at the lowest chip potential), or, alternatively, the source region may be left floating. In other words, the embodiments of FIGS. 1-3 are not limited to a source follower configuration. Each of the transistor structures of the present invention may be implemented as a four-terminal device, wherein the drain, source, field plate members, and insulated gate members are connected to a separate circuit terminal. In another embodiment, the field plate and insulated gate members may be connected together.

Figure 4:
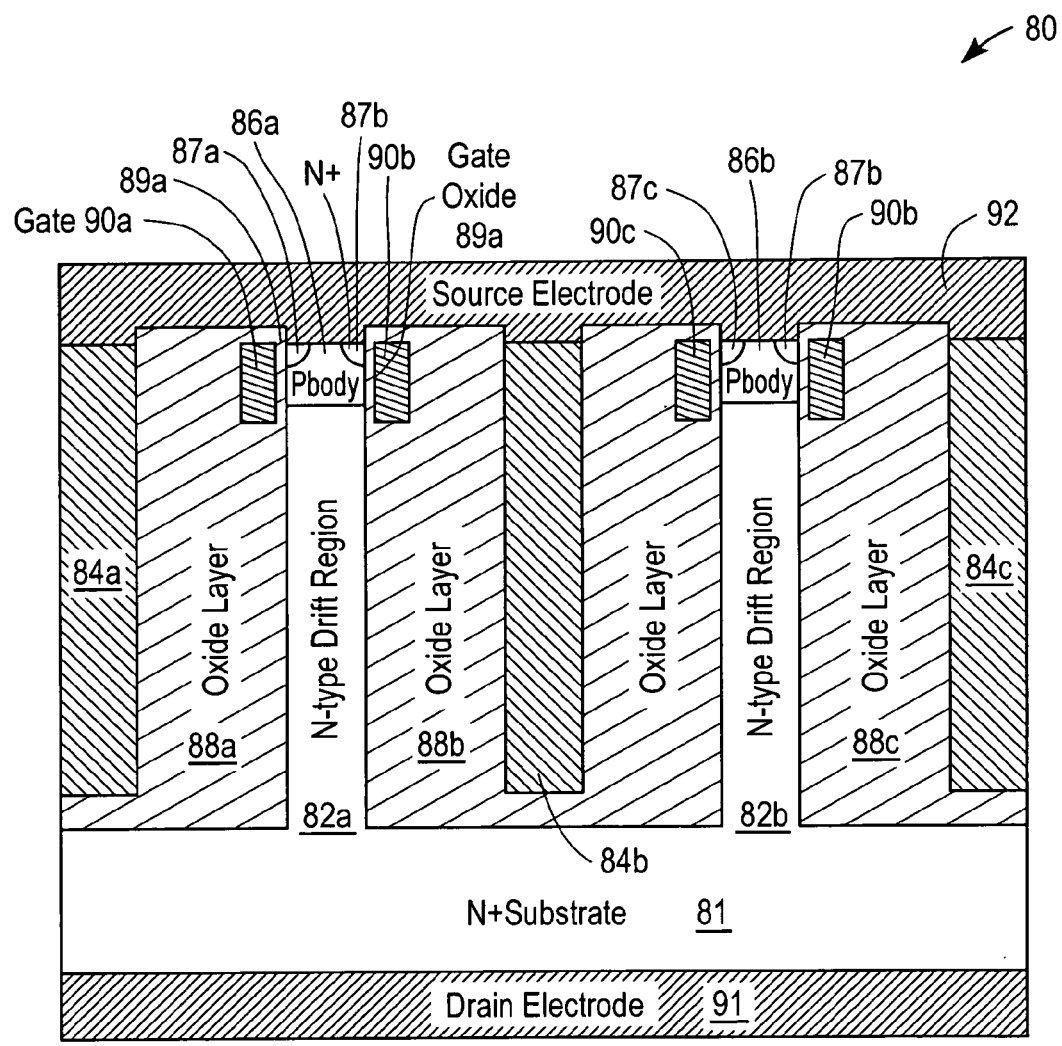
FIG. 4 is a cross-sectional side view of another embodiment of a vertical HVFET device structure fabricated according to the present invention.

With reference now to FIG. 4, there is shown a cross-sectional side view of another embodiment of a vertical HVFET transistor 80 constructed according to the present invention. The device structure shown in FIG. 4 is similar to that of FIG. 1, except that the planar gate has been replaced by a trench gate structure. As in the vertical device structure of FIG. 1, transistor 80 comprises one or more N-type drift regions 82 that extend vertically from P-body regions 86 down to the N+ substrate 81. Each of the drift regions 82 is adjoined on both sides by an oxide layer 88. For example, N-type drift region 82a is bounded on one side by oxide layer 88a and on the opposite side by oxide layer 88b.

Disposed within each of the oxide layers 88, and fully insulated from the drift region and substrate semiconductor materials, is a field plate member 84 that may be electrically connected to source electrode 92. The N-type drift regions 82, oxide layers 88, and field plate members 84 collectively comprise a parallel layered structure that extends in a lateral direction, which is perpendicular to the direction of current flow in the on-state.

The trench gate structure of vertical HVFET transistor 80 comprises gate members 90 disposed between field plate members 84 and P-body regions 86. In the embodiment of FIG. 4, a pair of N+ source regions 87 is disposed in each of P-body regions 86 on opposite sides. Each P-body region 86 is located at one end of a corresponding N-type drift region 82. A thin gate-insulating layer 89 (e.g., oxide) insulates each of gate members 90 (e.g., polysilicon) from the P-body semiconductor material.

For example, FIG. 4 shows gate members 90a & 90b disposed along opposite sides of P-body region 86a. N+ source regions 87a & 87b are disposed in P-body region 86a at opposite sides adjacent to the gate members; both regions 87a & 87b are electrically connected to source electrode 92. A portion of P-body regions 86 extends between the N+ source regions 87 and drift region 82. When transistor 80 is in the on-state conducting channel regions are formed along the sides of P-body region 86a such that current flows from source electrode 92, through N+ regions 87, across P-body 86, down through N-type drift regions 82 and N+ substrate 81, to drain electrode 91.

Practitioners in the art will appreciate that the pair of N+ source regions 87 shown disposed in each P-body region 86 of FIG. 4 may alternatively be replaced by a single N+ region that extends across the full width of region 86 adjacent to source electrode 92. In this case, the P-body region may be connected to the source electrode at various points (dimensionally into the page of the figure.) In one embodiment, source electrode 92 may protrude through N+ source 87 to contact the underlying P-body region 86 (see FIG. 5K).

The trench gate structure of the embodiment of FIG. 4 potentially offers an advantage of a simplified manufacturing process, due to the elimination of the T-shaped semiconductor regions shown in FIG. 1. Also, the vertical HVNMOS structure of transistor 80 may provide lower on-resistance due to the elimination of the JFET structure formed between the P-body regions.

Figure 7:
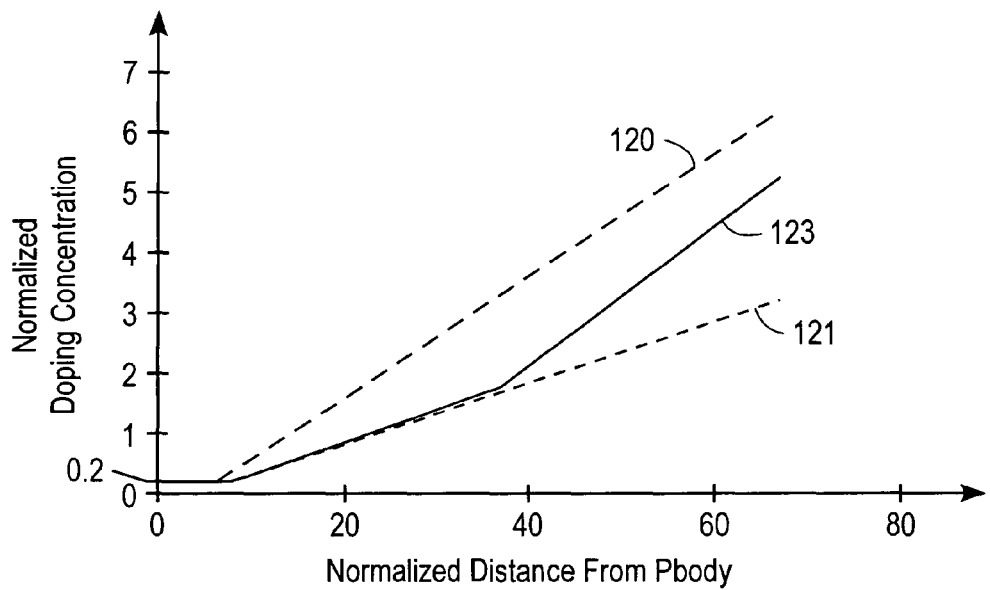
FIG. 7 is a plot showing normalized drift region doping profile versus normalized distance from the P-body region for two single gradient device designs, and for a two-gradient device according to one embodiment of the present invention.

FIG. 7 shows a normalized plot 123 of the doping profile concentration within drift region 82 versus vertical distance from P-body region 86 in accordance with one embodiment of the present invention. Plot 123 illustrates the novel concept of a dual-gradient doping in drift region 82; that is, the doping concentration in the drift region nearest the P-body region (i.e., nearest the source) has a first gradient, and the doping concentration in the drift region farthest from the P-body region (i.e., nearest the drain) has a second gradient, with the latter gradient being larger than the former. In one implementation, the gradient of the doping concentration nearest the drain is at least 10% larger than the gradient of the doping concentration nearest the source.

In FIG. 7, plots 120 and 121 depict single-gradient doping concentration profiles optimized for the off-state and on-state $V_{bd}$ respectively. Practitioners in the semiconductor arts will understand that the electric field component in the vertical direction parallel to the drift region is proportional to the gradient of the doping profile. This means for a given drift length, a transistor device fabricated with the single-gradient doping profile of plot 120 is characterized by an off-state breakdown voltage that is higher than a device fabricated with the single-gradient doping profile of plot 121.

Practitioners in the semiconductor arts will also appreciate that the multiplication factor due to impact ionization increases exponentially with the electric field. Hence, a HVFET fabricated with the single-gradient doping profile of plot 120 is characterized by a higher multiplication factor compared to a HVFET fabricated with the single-gradient doping profile of plot 121. This produces a lower on-state breakdown voltage for the HVFET fabricated with the single-gradient doping profile of plot 120 compared to the HVFET fabricated with the single-gradient doping profile of plot 121.

The HVFET structure of the present invention, which has a multiple-gradient doping profile exemplified by plot 123, achieves optimization of both the on-state and off-state breakdown voltages. For instance, in the upper section of the drift region nearest the source electrode, the lower doping concentration gradient improves the on-state breakdown voltage by limiting the multiplication factor in this portion of the drift region. At the same time, the lower section of the drift region nearest the drain electrode has a higher doping concentration gradient, which results in higher electric fields in this portion of the drift region, thereby increasing the off-state breakdown voltage of the device.

By way of further example, in one embodiment of the present invention, a HVFET structure as shown in FIG. 4 with a 600V breakdown voltage may be fabricated with a multi-gradient N-type drift region 22 having a width in a range of about 1-3 μm, a drift region length of about 40-60 μm, and a dielectric layer width (as measured between field plate 24 and drift region 22) of approximately 3-5 μm. The drift region may have a section of constant doping in a range of about $1 \times 10^{15}$ cm$^{-3}$ to $2 \times 10^{15}$ cm$^{-3}$ for the first 0-5 μm below the P-body region. The next lower section of the drift region may have a doping concentration that increases linearly with a first gradient to a concentration of about $1 \times 10^{16}$ cm$^{-3}$ to $2 \times 10^{16}$ cm$^{-3}$ near the middle (vertical depth) of drift region 22. At that point, the doping concentration may increase linearly, but with a higher gradient, to a level of about $4 \times 10^{16}$ cm$^{-3}$ to $5 \times 10^{16}$ cm$^{-3}$ at the drain end of the drift region, i.e., near substrate 81.

It is appreciated that the specific gradients and the drift region depth at which the gradient changes can vary in combination with the drift region width, drift region length, dielectric width, etc., in order to implement a transistor device with higher or lower breakdown voltages in the on and off states. It should also be understood that the concept of a multi-gradient drift region may be utilized in a variety of different transistor structures. For instance, each of the device structures shown in FIGS. 1, 2, 3, 4, 5G, 5K, and 6 (see discussion below) may utilize a multi-gradient drift region doping concentration profile to optimize device performance.

Figure 8:
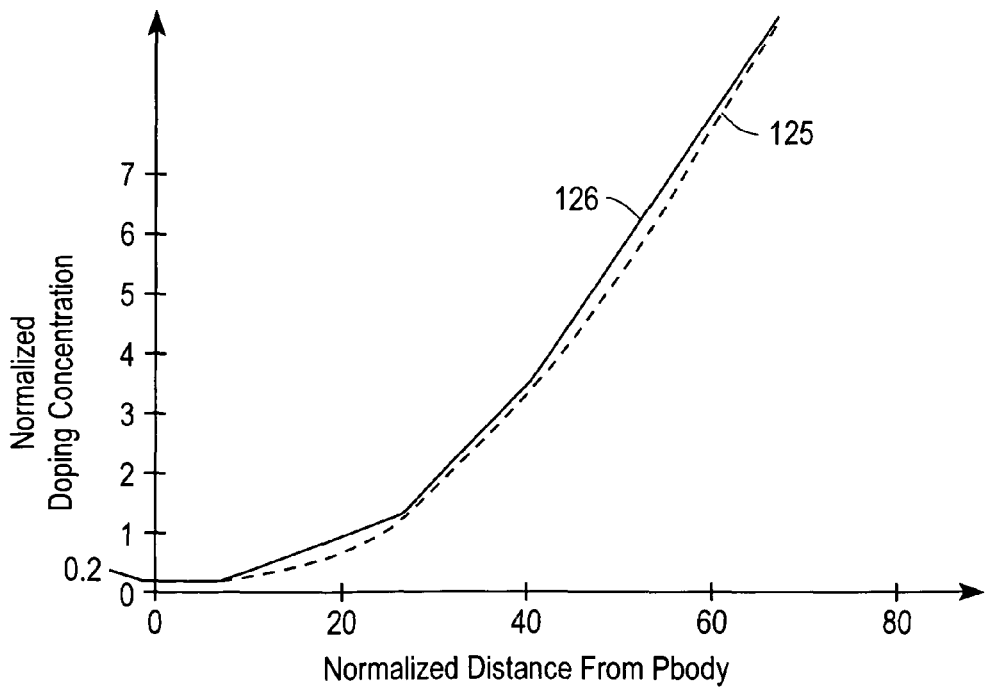
FIG. 8 is a plot showing normalized drift region doping profile versus normalized distance from the P-body region for a continuous gradient device, and for a three-gradient device in accordance with additional embodiments of the present invention.

FIG. 8 is a plot showing normalized drift region doping versus normalized distance from the P-body region for a device with a continuously varying doping concentration gradient, and for a three-gradient device, in accordance with additional embodiments of the present invention. As can be seen, plot 126 depicts a drift region doping profile with three different linearly-graded, vertically-stacked sections—the steepness of the gradient progressively increasing in each successively deeper drift region section (i.e., approaching the drain electrode). It is appreciated that a HVFET in accordance with the present invention may have a drift region doping profile with any number of linearly-graded sections—approaching and including the continuously varying doping concentration gradient of plot 125, wherein the doping concentration varies in an approximate quadratic relationship (e.g., $y=x^2$) with the vertical depth of the drift region. In one embodiment, the gradient of the doping concentration in the uppermost section of the drift region (i.e., nearest the P-body or source) is at least 10% less than the gradient of the doping concentration in the lowermost section (i.e., nearest the drain).

FIGS. 5A-5K illustrates the various processing steps that may be utilized to fabricate a vertical high-voltage transistor in accordance with the present invention. The described fabrication method may be used not only to form the device of FIG. 5K, but also the vertical device structure shown in FIG. 4.

Figure 5A:
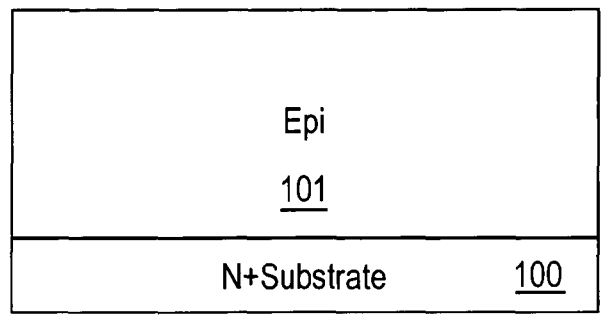
FIGS. 5A-5K are cross-sectional side views of a vertical HVFET device structure taken at various stages in a fabrication process in accordance with yet another embodiment of the present invention.

FIG. 5A shows a vertical high-voltage transistor after the initial processing step of forming an epitaxial layer 101 of n-type semiconductor material on an N+ substrate 100. To support applied voltages in the range of 200V to 1000V the device structure should have an epitaxial layer that is about 15 um to 120 um thick. The N+ substrate 100 is heavily doped to minimize its resistance to current flowing through to the drain electrode, which is located on the bottom of the substrate in the completed device. Substrate 100 may be thinned, for example, by grinding or etching, and metal may be deposited on its bottom surface to further reduce the on-resistance of the transistor. Most often, these processing steps would be performed after the topside processing has been completed.

The thickness and doping of epitaxial layer 101 largely determine the breakdown voltage of the device. The doping may be carried out as the epitaxial layer is being formed. For example, the doping concentration may be highest near the drain (at the bottom, adjacent to N+ substrate 100) and lowest near the source (at the top). In certain implementations, linear grading may stop at some point below the top surface of the epitaxial layer 101.

Figure 5B:
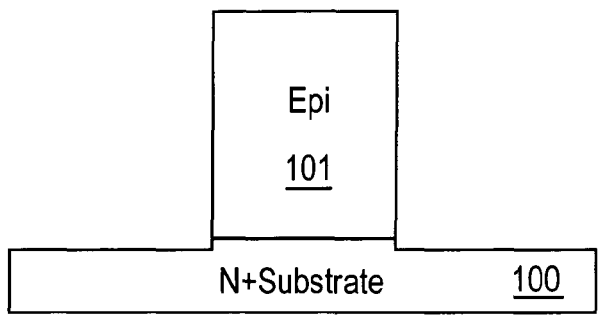

After the epitaxial layer 101 has been formed, the top surface of layer 101 is appropriately masked and deep trenches are then etched into, or alternatively completely through, the epitaxial layer. FIG. 5B shows a cross-sectional view of the device structure following etching of epitaxial layer 101 and part of substrate 100. Note that the lateral width of the etched trenches is determined by the combined thickness of the dielectric and conductive refill layers, as described below.

Spacing between adjacent trenches is determined by the required width of the remaining mesa of epitaxial layer material, which, in turn, is governed by the breakdown voltage requirements of the device. It is this mesa of epitaxial material that eventually forms the N-type drift region of the device structure. It should be understood that this mesa of material might extend a considerable lateral distance in an orthogonal direction (into the page). Although the embodiment of FIG. 5 illustrates a device having an extended drain region that comprises a single N-type drift region, it is appreciated that the vertical high-voltage transistor of FIG. 5 may be constructed with a plurality of parallel-arranged N-type drift regions. Making the width of the N-type drift region(s) narrow allows for high Vbd by limiting the ionization path. In certain implementations, drift regions with larger widths may offer advantages in on-state performance. Therefore, it should be understood that the mesa width may be optimized for a given device requirement and manufacturing capability. In one implementation, the thickness is in the approximate range of 0.4 to 3.0 microns. In this example, the thickness of the mesa is about 1 um.

Figure 5C:
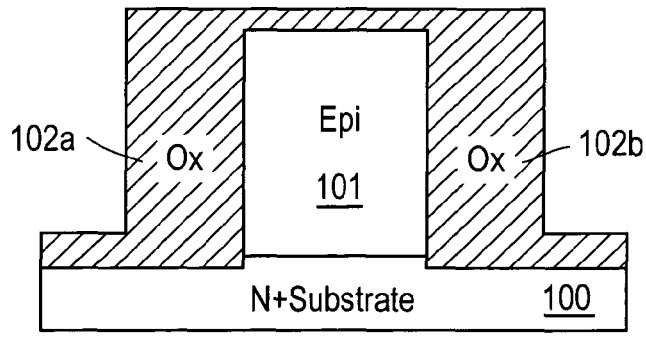

FIG. 5C shows the device structure of FIG. 5B after partial filling of the etched trenches with a dielectric material, e.g., silicon dioxide. As shown, in the embodiment of FIG. 5 oxide region 102a covers one side of etched epitaxial region 101, while oxide region 102b covers the other side of epitaxial region 101. Oxide region 102 also covers the top surface of N+ substrate 100 in each of the trenches.

The dielectric material may be introduced into the trenches using a variety of well-known methods. For instance, regions 102 may be grown thermally, deposited by chemical vapor deposition, and/or spun on in liquid form. For a given width of the mesa formed from epitaxial layer material 101, the width of the dielectric layer may be set to provide a required breakdown voltage, with wider dielectric layers providing a higher Vbd. In one implementation, the device structure of FIG. 5 has an oxide layer width of 4 um. For devices with other $V_{bd}$ performance, this thickness may be in the range of about 2 um-5 um.

Figure 5D:
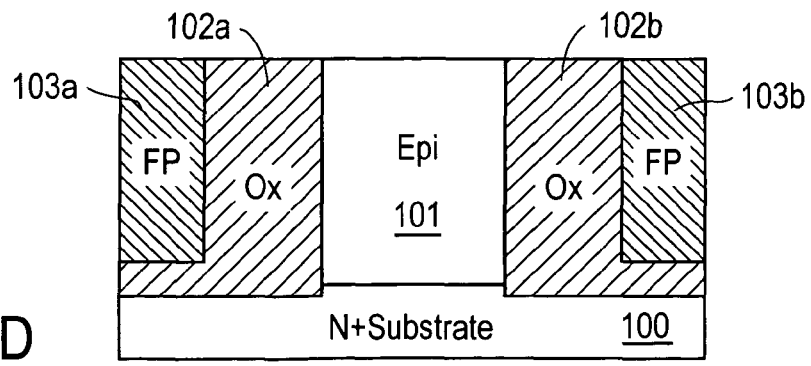

FIG. 5D illustrates the device structure of FIG. 5C following the steps of filling the remaining portions of the trenches with a conductive material and planarizing the surface to form field plate regions 103. For example, the conductive material may comprise a heavily doped polysilicon, a metal (or metal alloys), and/or silicide. Conductor regions 103a and 103b form the field plate members of the device. In most cases, field plate members 103a and 103b should be made as narrow as can be reliably manufactured, since the field plate members occupy silicon area without directly contributing to device conductivity or breakdown voltage characteristics. In one embodiment, the width of field plate members 103 is approximately 0.5 um-3.0 um. The planarization of the surface may be performed by conventional techniques such as etch-back and/or chemical-mechanical polishing.

At this point in the process, fabrication of the extended drain region of the device is essentially complete. The remaining processing steps may be adapted to produce a stand-alone, high-voltage, depletion-mode MOSFET device structure (as shown in FIG. 5G and FIG. 6) or a high-voltage FET that incorporates a low-voltage MOSFET structure (e.g., FIG. 5K), or other high-voltage devices.

Figure 5E:
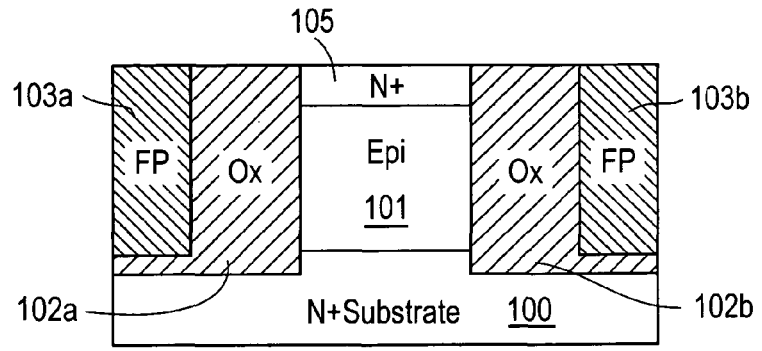

FIG. 5E is a cross-sectional side view of the device structure of FIG. 5D after the introduction of an N+ source region 105 at the top surface of epitaxial layer 101. Source region 105 may be formed using ordinary deposition, diffusion, and/or implantation processing techniques.

After formation of the N+ source region 105 an interlevel dielectric layer 106 if formed over the device. In the embodiment of FIG. 5, interlevel dielectric layer 106 may comprise ordinary silicon dioxide and/or another material that may be deposited and patterned by conventional methods. Openings are formed in dielectric layer 106 and one or more conductive materials (e.g., metal, silicide, etc.) are deposited and patterned to produce the structure shown in FIG. 5F. In this cross-sectional view, source electrode 109 provides electrical connection to N+ source region 105, and electrodes 110a and 110b provide electrical connection to field plate members 103a and 103b, respectively.

Figure 5F:
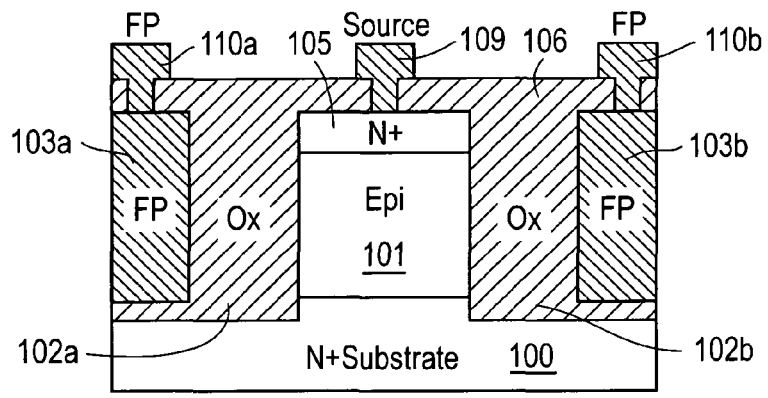
Figure 5G:
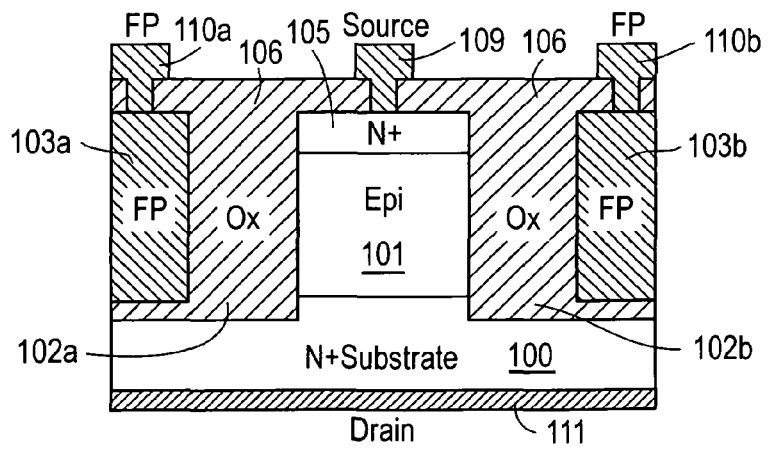
Figure 5H:
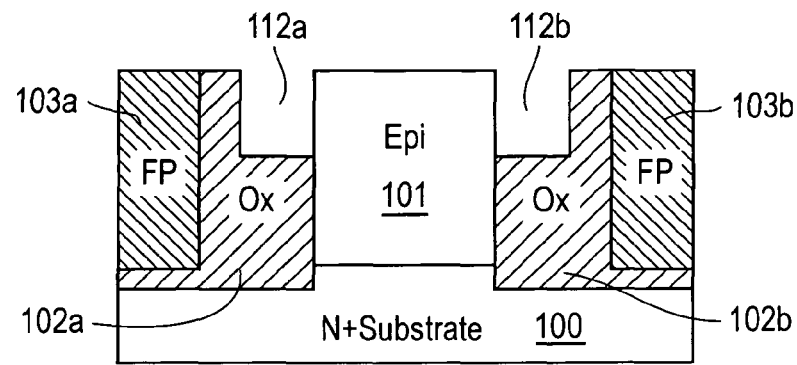
Figure 6:
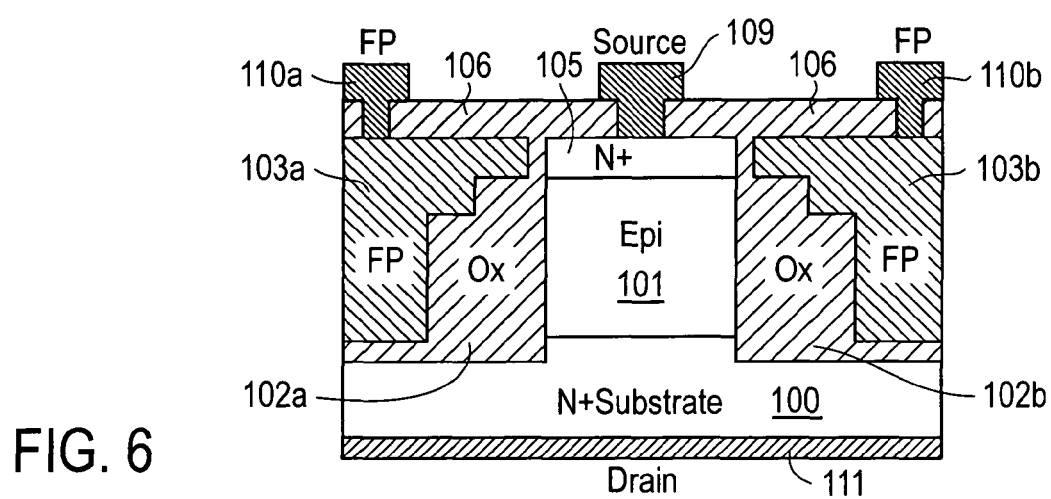
FIG. 6 is a cross-sectional side view of still another embodiment of a vertical HVFET device structure fabricated according to the present invention.

FIG. 5G shows the device structure of FIG. 5F following formation of a drain electrode 111 on the bottom of N+ substrate 100. For example, drain electrode 111 may be formed using the conventional technique of metal sputtering. As described earlier, the bottom of the substrate may first be subjected to grinding, implanting, etc., to lower the drain contact resistance.

The device of FIG. 5G represents a completed high-voltage transistor having a stand-alone drift region; that is, the device of FIG. 5G does not include a low-voltage, series MOSFET structure at the top of the epitaxial layer. Instead, the extended drift region formed by the epitaxial layer, itself, performs the function of the MOSFET without the inclusion of a P-body region. Practitioners in the arts will note that in this device structure current cannot be completely turned-off, since there exists a continuous n-type path for electrons to flow from source electrode 109 to drain electrode 111. Current flow in the device structure of FIG. 5G, however, does saturate when the mesa-like epitaxial layer 101 is pinched-off at high drain voltages.

The device structure of FIG. 6 achieves pinch-off of the extended drain region at lower voltages than the device of FIG. 5G. This is achieved by reducing the spacing between the field plate members 103 and epitaxial layer 101 near the top of the N-type drift region, thereby increasing the capacitance to pinch-off the vertical drift region at a relatively low voltage. FIG. 6 shows a multi-tiered field plate structure extending laterally into oxide regions 102a & 102b to control the pinch-off voltage and, therefore, the saturation current. Alternatively, the field plate members may comprise a single step, a linearly graded lateral extension, or some other profile shape designed to achieve the same result.

Those skilled in the arts will appreciated that for certain circuit applications it may be advantageous to utilize the stand-alone transistor structure of FIG. 5G (or FIG. 6) in series with an ordinary external, low-voltage switching MOSFET. In such an application the low-voltage (e.g., 40V) MOSFET could be used for switching purposes in order to completely turn off current flow in the high-voltage (e.g., 700V) transistor device.

Referring now to FIGS. 5H-5K, there is shown an alternative processing sequence that may be used to fabricate a vertical HVNMOS transistor that includes an insulated gate MOS structure.

Trenches 112a and 112b are formed in respective dielectric layers 102a and 102b on opposite sides of epitaxial layer 101 to accommodate the formation of the insulated gate structure. The depth of trenches 112a and 112b extends from the surface of epitaxial layer 101 to a depth governed by the intended MOSFET channel length and field plating considerations. In this example, the trench depth is about 1-5 um. By way of example, trenches 112 may be formed by appropriate application of a patterned masking layer to the semiconductor substrate followed by conventional dry or wet etching techniques into oxide layer 102.

Figure 5I:
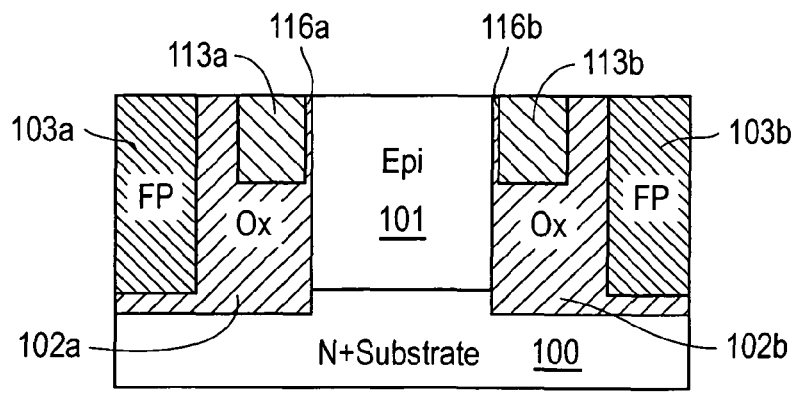

FIG. 5I shows the device after formation of gate dielectric layers 116 and gate members 113 within trenches 112. The gate dielectric layers 116a & 116b may be formed by growing or depositing oxide on the sidewalls of the exposed epitaxial layer 101. The device threshold voltage and other device performance targets determine the thickness of layers 116. In one embodiment, layers 116 comprise silicon dioxide having a thickness on the order of 250-1000 angstroms.

In the embodiment shown, a portion of dielectric layer 102 isolates field plate members 103 from gate members 113. Alternatively, trenches 112 may expose the top portion of field plate 103 and the same processing steps used to create layers 116 may also be used to form dielectric layers on the sidewalls of the field plates to isolate the field plates from the gate members.

Once dielectric layers 116 have been formed on the sidewalls of trenches 112, a conductive material, such as doped polysilicon, may be deposited to fill the remaining portions of the trenches. In this implementation, the doped polysilicon forms the gate members 113a and 113b of the MOS transistor structure. In the embodiment of FIG. 5I, the surface has been planarized using conventional etch-back and/or CMP techniques.

Figure 5J:
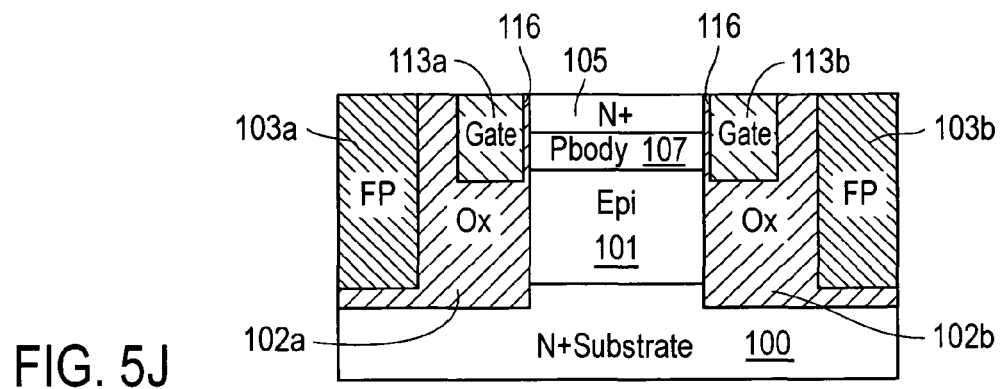

FIG. 5J shows the device after introduction of a P-body region 107 and a N+ source region 105 at the top surface of epitaxial region 101. Regions 107 and 105 may be formed using standard implantation, deposition, and/or thermal diffusion processing steps. In the completed device, application of a sufficient voltage to gate members 113 causes a conductive channel to be formed along the sidewall portions of P-body region 107 between N+ source region 105 and epitaxial region 101. The channel length is therefore determined by the depth of P-body region 107, and N+ source region 105. For the particular embodiment shown the former may be approximately 0.5 um-3.0 um, and the latter in the range of about 0.1-0.5 um. A shorter channel length results in a lower channel resistance, which likewise reduces the on-resistance of the device. It should be understood, however, that a too short channel would cause punch-through problems. In other embodiments, the P-body and/or N+ source may be formed earlier in the process, for example before the trench etching of the epitaxial layer 101, or before the trench etching of the oxide layer 102.

Figure 5K:
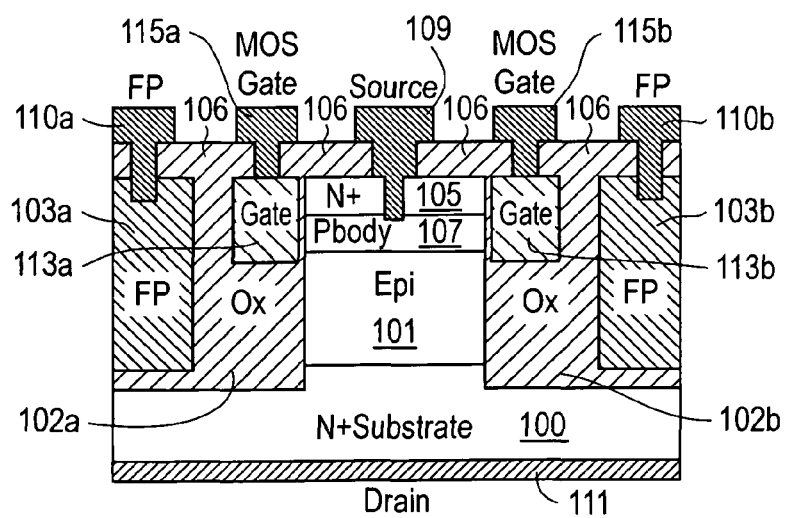

FIG. 5K shows the completed HVFET device structure following formation of an interlevel dielectric layer 106 (e.g., silicon dioxide, silicon nitride, etc.). This layer may be deposited and patterned to form contact openings. In the embodiment shown, the etching of layer 106 is followed by etching of the field plates, gate members, N+ and P-body regions. This is followed by deposition and patterning of one or more conductive layers (e.g., metal, silicide, etc.) to create source electrode 109, gate electrodes 115, and field plate electrodes 110, which provide electrical connection to the respective regions of the device. The optional etching step described above allows the source electrode to contact the P-body region without patterning the N+ source region, thus simplifying the process. An additional P-type doping process may also be included for improved contact to the P-body. A conductive layer may also be applied to the bottom of substrate 100 (after optional treatment by grinding, etching, implanting, etc.) to form the drain electrode 111.

Note that while source electrode 109 is shown extending down to P-body 107 in the cross-sectional view of FIG. 5K, in other embodiments electrode may only extend to the upper surface of source region 105.

We claim:

1. A power transistor comprising:
    a drain which comprises a substrate of a first conductivity type;
    a mesa of the first conductivity type having first and second sidewalls, the substrate comprising a bottom portion of the mesa, an upper portion of the mesa comprising a source, a drift region comprising a middle portion of the mesa, the drift region extending in a vertical direction from the drain to the source, the drift region comprising first and second sections having first and second doping concentration gradients, respectively, the first section extending a first vertical distance below the source and having a lowest doping concentration nearest the source and a highest doping concentration farthest from the source, the second section being disposed beneath the first section and having a lowest doping concentration nearest the first section and a highest doping concentration farthest from the first section, the highest doping concentration of the first section being substantially the same as the lowest doping concentration of the second section, the source having a doping concentration greater than the lowest doping concentration of the first section; and first and second field plate members respectively disposed on opposite sides of the drift region, each of the field plate members being respectively insulated from the first and second sidewalls of the mesa by a dielectric material, the first and second field plate members also being insulated from the substrate, the first and second field plate members extending in the vertical direction from adjacent the upper portion to adjacent the bottom portion of the mesa.

2. The power transistor of claim 1 wherein the first and second doping concentration gradients are each substantially linear.

3. The power transistor of claim 1 wherein the second doping concentration gradient is at least 10% higher that the first doping concentration gradient.

4. The power transistor of claim 1 wherein the drift region further comprises a third section, the third section being disposed beneath the second section and having a lowest doping concentration nearest the second section and a highest doping concentration farthest from the second section, the highest doping concentration of the second section being substantially the same as the lowest doping concentration of the third section.

5. The power transistor of claim 1 wherein the drift region comprises an epitaxial layer formed over the substrate.

6. The power transistor of claim 1 further comprising a drain electrode formed on a bottom surface of the substrate, the drain electrode being electrically connected to the drain.

7. The power transistor of claim 1 further comprising a source electrode electrically connected to the source.

8. The power transistor of claim 7 wherein the source electrode is also electrically connected to the first and second field plates.

* * * * *